United States Patent
Yamada et al.

(10) Patent No.: US 7,883,837 B2
(45) Date of Patent: Feb. 8, 2011

(54) TRANSPARENT ELECTRICALLY CONDUCTIVE FILM AND PROCESS FOR PRODUCING THE SAME

(75) Inventors: Kohei Yamada, Fukui (JP); Hidekazu Shiomi, Fukui (JP); Hideyuki Yamada, Fukui (JP)

(73) Assignee: Seiren Co., Ltd., Fukui-Shi, Fukui (JP)

( * ) Notice: Subject to any disclaimer, the term of this patent is extended or adjusted under 35 U.S.C. 154(b) by 178 days.

(21) Appl. No.: 11/918,700

(22) PCT Filed: Apr. 18, 2006

(86) PCT No.: PCT/JP2006/308504

§ 371 (c)(1),
(2), (4) Date: Oct. 17, 2007

(87) PCT Pub. No.: WO2006/112535

PCT Pub. Date: Oct. 26, 2006

(65) Prior Publication Data

US 2009/0042150 A1    Feb. 12, 2009

(30) Foreign Application Priority Data

Apr. 18, 2005    (JP) .............................. 2005-119492

(51) Int. Cl.
*G03F 1/00*    (2006.01)
*H01L 21/00*    (2006.01)

(52) U.S. Cl. ...................... 430/320; 430/311; 430/322; 205/164; 205/167; 205/205

(58) Field of Classification Search ................. 430/311, 430/320, 322; 205/164, 167, 205
See application file for complete search history.

(56) References Cited

U.S. PATENT DOCUMENTS

| | | | | |
|---|---|---|---|---|
| 6,188,174 B1 * | 2/2001 | Marutsuka | ................... | 313/479 |
| 2004/0070041 A1 * | 4/2004 | Obayashi et al. | ............ | 257/437 |

FOREIGN PATENT DOCUMENTS

| | | | |
|---|---|---|---|
| JP | 10-41682 | | 2/1998 |
| JP | 10-41682) | * | 2/1998 |
| JP | 10-341094 | | 12/1998 |
| JP | 11-170421 | | 6/1999 |

(Continued)

OTHER PUBLICATIONS

Bio Ind. 2004, vol. 21, No. 3, pp. 46-53.

*Primary Examiner*—Thorl Chea
(74) *Attorney, Agent, or Firm*—Dilworth & Barrese, LLP.

(57) ABSTRACT

This invention provides a transparent electrically conductive film, which, while maintaining the light transparency of a transparent film, has excellent electrical conductivity, can be utilized for electromagnetic wave shielding, and does not cause inclusion of air bubbles in the lamination onto other base material, and a process for producing the same. The production process comprises the steps of forming a large number of concaves and convexes having an average height of not more than 0.1 μm on both sides or one side of a transparent film, forming a resist layer having a pattern shape opposite to the electrically conductive part in the electrically conductive film on the transparent film on its concave-convex side, applying a catalyst for plating onto the resist layer-formed face, separating the resist layer, forming a metal layer by plating, and blackening the metal layer, the metal layer satisfying 1≦W/T≦500 wherein W represents the width of the metal layer and T represents the height of the metal layer.

5 Claims, 1 Drawing Sheet

FOREIGN PATENT DOCUMENTS

| | | |
|---|---|---|
| JP | 11-298185 | 10/1999 |
| JP | 2000-261186 | 9/2000 |
| JP | 2001-156489 | 6/2001 |
| JP | 2001-332889 | 11/2001 |
| JP | 2003-23289 | 1/2003 |
| JP | 2004-193168 | 7/2004 |

* cited by examiner

TRANSPARENT ELECTRICALLY CONDUCTIVE FILM AND PROCESS FOR PRODUCING THE SAME

FIELD OF THE INVENTION

The present invention relates to a transparent, electrically conductive film as a light transmitting electromagnetic wave shielding material for use in a filter disposed on a front display surface of, for example, a CRT or a plasma display panel or in a display part of a measuring instrument, as well as a process for producing such a film. More particularly, the present invention is concerned with a transparent, electrically conductive film having an electromagnetic wave shielding function and which permits a user to see through the interior of, for example, a microwave oven or a measuring instrument or a display surface of, for example, a CRT or a plasma display panel.

BACKGROUND OF THE INVENTION

As conventional processes for producing an electrically conductive film which can shield electromagnetic waves while maintaining satisfactory light transparency there are known, for example, a process in which a transparent, electrically conductive film such as, for example, indium-tin oxide film (ITO film) is formed as a thin film on the surface of a transparent glass or plastic substrate by vapor deposition or sputtering or a process in which a thin metal film is formed throughout the whole surface of a transparent glass or plastic substrate by metal plating or vapor deposition and is then processed for example by photolithography to form a fine mesh of the thin metal film.

The above transparent, electrically conductive film having ITO film on a transparent substrate is superior in light transparency, but is inferior in electrical conductivity and cannot afford satisfactory electromagnetic wave shielding properties in comparison with the transparent, electrically conductive film having a mesh-like thin metal film. On the other hand, in the process involving forming a thin metal film on a transparent substrate and processing it into mesh-like, since most of the thin metal film is removed, this is wasteful and results in an increase of the production cost, although there is attained high electrical conductivity.

In an effort to solve the above-mentioned problems, for example in JP 62-57297A and JP 2-52499A there is proposed a process wherein electrically conductive ink or ink containing an electroless plating catalyst is printed in the shape of a pattern consisting of thin lines onto a base material such as a transparent film or glass and thereafter metal is plated onto the ink layer. According to this process, however, it is difficult to prepare a pattern using thin lines not larger than 30 μm in line width, and a large line width results in deterioration of light transparency; besides, when the transparent, electrically conductive film formed by this process is used as an electromagnetic wave shielding material for display, it is inferior in image visibility.

Further, when the transparent, electrically conductive film is used as an electromagnetic wave shielding material for PDP, it is laminated to, for example, an infrared absorbing film with use of an adhesive. In this case, in the transparent, electrically conductive film formed by the above process, the ink layer after printing is thick and concaves and convexes on the print surface are large, so when the adhesive is applied to the surface of one film and this film is laminated to the other film, there easily occurs inclusion of air bubbles and image visibility is deteriorated in the presence of such air bubbles.

On the other hand, in JP 2000-137442A there is proposed a process involving laminating a transparent base material and metal foil to each other with use of an adhesive and thereafter making the metal foil mesh-like by photolithography. According to this an adhesive and thereafter making the metal foil mesh-like by photolithography. According to this process, thin lines not larger than 20 μm in line width permits the attainment of high light transparency, but a warp caused by the adhesive is apt to occur. Moreover, as is the case with the process referred to previously, since the metal foil thickness is not smaller than 10 μm, surface concaves and convexes become large and there occurs inclusion of air bubbles upon lamination to another member.

DISCLOSURE OF THE INVENTION

Object of the Invention

It is an object of the present invention to provide a transparent, electrically conductive film which, while maintaining the light transparency of a transparent film, has excellent electrical conductivity and can be utilized for electromagnetic wave shielding. More particularly, it is an object of the present invention to provide a transparent, electrically conductive film free from inclusion of air bubbles when laminated to another base material, as well as a process for producing such a film.

SUMMARY OF THE INVENTION

Having made extensive studies for solving the above-mentioned problems, the present inventors invented a transparent, electrically conductive film of the following configuration. According to the present invention there is provided a process for producing a transparent, electrically conductive film, comprising the steps of forming a multitude of concaves and convexes having an average height of not larger than 0.1 μm on both sides or one side of a transparent film, forming a resist layer having a pattern shape opposite to that of the electrically conductive portion of the electrically conductive film on the transparent film on its concave-convex side, applying a catalyst for plating onto the resist layer-formed face, separating the resist layer, forming a metal layer by plating, and blackening the metal layer, the metal layer having a width W to height T ratio, W/T, of $1 \leq W/T \leq 500$.

It is preferable that the concaves and convexes on both sides or one side of the transparent film be formed by incorporating a filler in the transparent film. In this connection, it is preferable that the difference in refractive index of light between the filler and the transparent film be not larger than 0.15. Preferably, the transparent film is a polyethylene terephthalate film and the filler is silica or alumina.

EFFECTS OF THE INVENTION

According to the present invention it is possible to provide an electrically conductive film which, while maintaining the light transparency of a transparent film, has excellent electrical conductivity and can be utilized for electromagnetic wave shielding. Further, it is possible to provide a transparent, electrically conductive film free from separation of a metal layer and inclusion of air bubbles when laminated to another base material and which can be produced in high yield and inexpensively through a reduced number of manufacturing steps.

Figure 1:
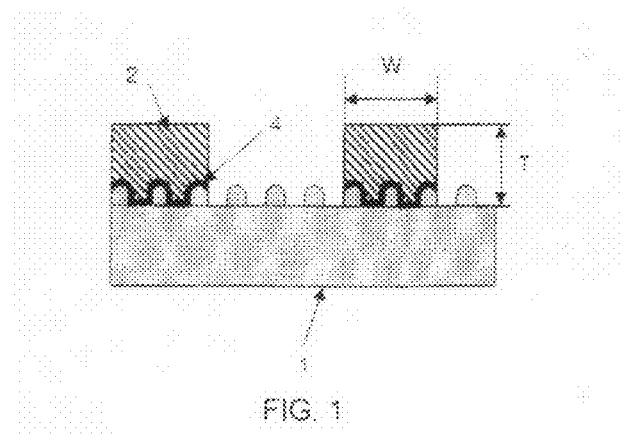
FIG. 1 is a sectional view of a transparent, electrically conductive film according to an embodiment of the present invention.

In the drawings, the reference numeral 1 denotes a transparent film, 2 a metal layer, 3 a resist layer, 4 a catalyst for plating, W stands for the width of the metal layer, and T stands for the height of the metal layer 2.

EMBODIMENTS OF THE INVENTION

Embodiments of the present invention will be described in detail hereinunder with reference to the drawings.

Figure 2:
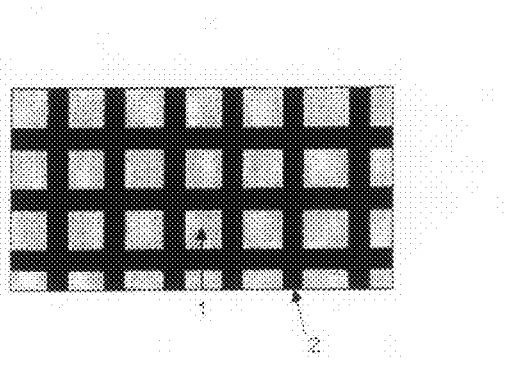
FIG. 2 is a plan view thereof.
Figure 3:
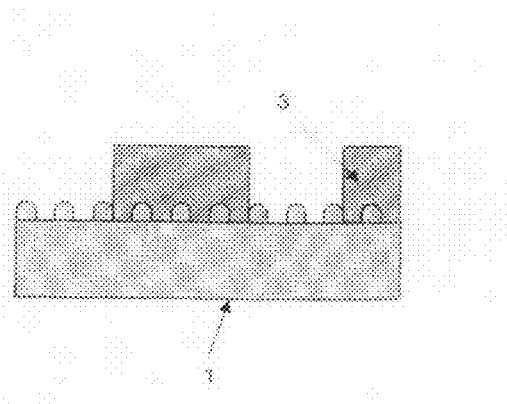
FIG. 3 is a sectional view showing a manufacturing step (forming a resist layer) for the transparent, electrically conductive film.
Figure 4:
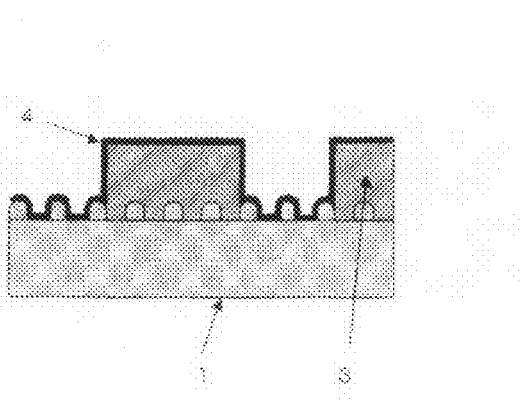
FIG. 4 is a sectional view showing another manufacturing step (applying a catalyst for plating) for the transparent, electrically conductive film.
Figure 5:
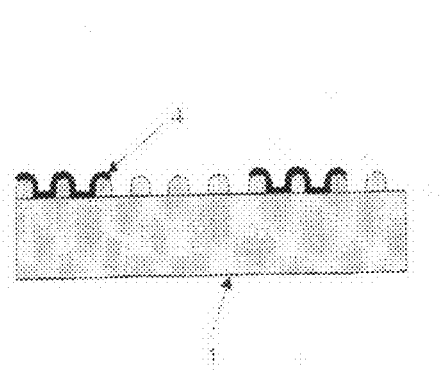
FIG. 5 is a sectional view showing a further manufacturing step (separating the resist layer) for the transparent, electrically conductive film.

FIG. 1 is a sectional view of a transparent, electrically conductive film embodying the present invention and FIG. 2 is a plan view thereof. FIGS. 3 to 5 are sectional views showing manufacturing steps for the transparent, electrically conductive film. In the drawings, the numeral 1 denotes a transparent film, 2 a metal film, and 3 a resist layer.

The transparent, electrically conductive film embodying the present invention comprises a transparent film 1 having a large number of concaves and convexes with an average height of not larger than 0.1 μm and a metal layer formed in a pattern shape on the transparent film 1 (see FIGS. 1 and 2). A process for producing the transparent, electrically conductive film according to the present invention comprises the steps of forming a large number of concaves and convexes having an average height of not larger than 0.1 μm on the surface of a transparent film 1, forming on the transparent film 1 a resist layer 3 having a pattern shape opposite to that of a metal layer 2 to be formed (FIG. 3), then applying a catalyst for plating onto the resist layer 3-formed face (FIG. 4), separating the resist layer (FIG. 5), forming a metal layer 2 by plating, and blackening the metal layer 2.

As examples of the transparent film 1 used in the present invention there are mentioned films of polyester resins such as polyethylene terephthalate, polybutylene terephthalate, polyethylene naphthalate, polyethylene terephthalate-isophthalate copolymer, and terephthalic acid-cyclohexanedimethanol-ethylene glycol copolymer, polyamide resins such as nylon 6, polyolefin resins such as polypropylene and polymethylpentene, acrylic resins such as polyacrylate, polymethacrylate, and polymethyl methacrylate, styrene resins such as ABS resin, cellulose resins such as triacetyl cellulose, as well as imide resins and polycarbonates. Film, sheet or board comprising at least one layer of resin selected from these resins is used as the transparent film. These shapes are generically called "film" herein. Usually, such polyester films as polyethylene terephthalate film and polyethylene naphthalate film are preferred because they are superior in transparency and heat resistance and are low in cost, with polyethylene terephthalate being most suitable.

The transparent film 1 may be a copolymer resin containing any of the above resins as a principal component, or a mixture (including alloy), or a laminate consisting of plural layers. The transparent film 1 may be a stretched film or an unstretched film, but a uniaxially or biaxially stretched film is preferred for the purpose of improving the strength of the film. The thickness of the transparent film 1 is usually 12 to 1000 μm, preferably 50 to 700 μm, most preferably 100 to 500 μm. If the thickness of the transparent film 1 is smaller than 12 μm, the mechanical strength will be insufficient, with consequent likelihood of occurrence of warping and slackening. If it exceeds 1000 μm, the light transparency of the film will be deteriorated or excessive performance will result, which is wasteful in point of cost.

On the surface of the transparent film 1 there are formed a metal layer 2 by plating and a large number of concaves and convexes having an average height of not larger than 0.1 μm for enhancing the adhesion to the transparent film 1 and for preventing separation of the metal layer. Such concaves and convexes can be formed by scraping the surface of the transparent film 1, for example, by etching with use of alkali or chromic acid or by sandblasting. Incorporation of a filler in the film resin may also be adopted. Above all, the method of incorporating a filler in the film resin is preferred because the number of additional steps is small.

As a method for forming the filler-containing resin into a film there is mentioned, for example, a biaxial stretching method. As another example there is mentioned a coating method. A preferred method involves casting and stretching a filler-containing resin onto a film not containing a filler. As the filler, one having an average particle diameter of not larger than 0.5 μm is preferred. If the particle diameter of the filler is smaller than 0.2 μm, concaves and convexes will not be formed to a satisfactory extent, with consequent likelihood of deteriorated adhesion of the metal layer. If the particle diameter of the filler exceeds 0.5 μm, the light transparency of the film will be deteriorated and so will be the visibility as an electromagnetic wave shielding material for display.

The material of the filler may be such an organic material as polymethacrylic ester, polyarylate, polystyrene, or polyethylene, or may be such an inorganic material as mica, talc, alumina, calcium carbonate, glass, silica, kaolin, or aluminosilicate, provided it is preferable that the difference in refractive index of light between the resin which constitutes the transparent film 1 and the filler be not larger than 0.15. If the difference in refractive index of light exceeds 0.15, there is a fear that the light transparency may be deteriorated. A preferred transparent film 1—filler combination is the use of polyethylene terephthalate as the transparent film and silica or alumina as the filler.

As examples of the method for forming the resist layer in the present invention there are mentioned printing and photolithography. As examples of printing methods there are mentioned lithographic offset printing, intaglio offset printing, gravure printing, screen printing, and flexographic printing.

According to photolithography, a resist is applied by coating or dipping onto the surface of the transparent film 1, or a photosensitive resist is formed uniformly throughout the surface of the transparent film by lamination of a dry film. Thereafter, exposure and development are performed using a photomask of a predetermined pattern, followed by a curing treatment if necessary. As a result, a resist pattern opposite to the pattern of the metal layer is formed on the transparent film (FIG. 3). The photosensitive resist used in the present invention is not specially limited. A conventional known photosensitive composition may be used, provided it is preferable to select one which has a sufficient resolving power and is easy to be peeled off.

The plating performed in the present invention may be carried out by electroless plating or electroplating, or a combination of the two. The metal layer 2 formed in the above manner may be blackened by oxidation or sulfuration.

With reference to electroless plating as an example, a concrete description will now be given about the plating process which is performed for forming the metal layer 2 in the present invention. First, an organic or inorganic material serving as a catalyst 4 for plating is applied to the surface of the transparent film 1 formed with the resist layer 3 (FIG. 4). As examples of the catalyst 4 for plating there are mentioned chlorides, sulfates, nitrates, organic salts and ammonium salts of iron, copper, nickel, cobalt, and palladium. The method for application of the plating catalyst is not specially limited. For example, there may be adopted a coating or dipping method.

The next process is a process of peeling off the resist layer 3. How to peel off the resist layer 3 is not specially limited. There may be adopted a peeling or removing method suitable for the resist used. By peeling off the resist layer 3 it is possible to obtain a transparent film with the catalyst for plating applied thereto in a desired pattern shape. By subjecting the transparent film to electroless plating it is possible to form the metal layer 2 and make the pattern into an electromagnetic wave shielding pattern.

For electroless plating there may be adopted a conventional method using copper or nickel, or an alloy thereof. By subsequent heat treatment it is possible to enhance the strength of adhesion to the film, or by oxidation or sulfuration to effect blackening it is possible to change the adhesiveness or color.

In the present invention, if necessary, another metal layer may be formed for example by electroplating onto the metal layer 2 thus formed by electroless plating. For electroplating there may be used a commonly-used metal such as copper or nickel, or an alloy thereof. The transparent film may be further subjected to electroless plating to enhance the electrical conductivity, or the metal layer 2 may be subjected to oxidation or sulfuration to effect blackening thereof, thereby causing a change in electrical conductivity or in color.

The pattern of the metal layer 2 in the present invention may take a stripe- or mesh-like shape. For example, it may be made mesh-like by combining plural such polygonal or circular shapes as triangular, quadrangular, hexagonal and octagonal shapes. The width W of the metal layer 2 is preferably 5-50 μm and the line-to-line space is preferably 100-700 μm. The metal layer may be biased to eliminate moiré. If the width W of the metal layer 2 is smaller than 5 μm, the metal layer will be deficient in electrical conductivity and there is a fear that it may be impossible to effect electromagnetic wave shielding to a satisfactory extent. If the metal layer width W exceeds 50 μm, it is likely that the light transparency will be deteriorated. Further, if the line-to-line space is smaller than 100 μm, there is a fear of light transparency being deteriorated, and if the space in question exceeds 700 μm, there is a fear of electrical conductivity being deteriorated.

The height T of the metal layer 2 is preferably 0.1-15 μm. If the metal layer 2 satisfies the condition of $1 \leq W/T \leq 500$ (width W, height T, of the metal layer 2), it is possible to prevent the inclusion of air bubbles when the transparent film is laminated to another base material. If the W/T ratio is less than 1, there will occur the inclusion of air bubbles upon lamination to another base material, with consequent fear of light transparency being deteriorated, and if the W/T ratio exceeds 500, the metal layer itself may cause deterioration of light transparency or peeling of the metal layer may become easier to occur.

A further film may be laminated to the transparent, electrically conductive film of the present invention, and in case of using the transparent, electrically conductive film as an electromagnetic wave shielding material for display, a near infrared absorbing layer, a reflection preventing layer, a hard coating layer, an antifouling layer, or an antiglare layer, may be formed on the film.

EXAMPLES

The present invention will be described below in more detail by way of examples, but the invention is not limited to the following examples. Transparent, electrically conducive films produced by the following working and comparative examples were evaluated in the following manner.

(1) Concaves/Convexes of Film and Height T of Metal Layer

A part of film was cut out and a thin piece thereof was cut out in a sectional direction with a microtome, then was observed and measured using a laser microscope (LEXT OLS3000, a product of Olympus Co., Ltd.).

(2) Width W of Metal Layer

The width of a metal layer of a transparent, electrically conductive film was measured from a surface of the same layer with use of a laser microscope (LEXT OLS3000, a product of Olympus Co., Ltd.).

(3) Electrical Conductivity

Measured using LORESTA AP (4-pin probe method) (a product of Mitsubishi Chemical Co., Ltd.).

(4) Transmittance

The transmittance of light (visible light) having a wavelength of 400 to 700 nm was measured using a spectromicroscope (MCPD2000, a product of Otsuka Electronics Co., Ltd.).

Examples 1-5 and Comparative Examples 1-5

Example 1

A layer containing silica (refractive index 1.46) with an average particle diameter of 0.1 μm was laminated to a surface of a polyethylene terephthalate (PET) film (light transmittance 92%, refractive index 1.55) having a thickness of 100 μm to afford a transparent film having concaves and convexes with an average height of 0.05 μm. Then, a photosensitive resist (PER20 SC03, a product of Taiyo Ink Mfg. Co., Ltd.) was applied onto the film surface to a thickness of 10 μm, followed by exposure and development, to fabricate a film having 300×300 μm resist locks arranged at 20 μm intervals. Next, an electroless plating catalyst (a palladium catalyst solution: OPC-80 Catalyst, a product of Okuno Pharmaceutical Co., Ltd.) was applied to the film surface and the resist was peeled off using a 5% aqueous NaOH solution as a release solution, followed by electroless copper plating (an electroless plating solution: OPC-750 Electroless Copper M, a product of Okuno Pharmaceutical Co., Ltd.), to afford a transparent, electrically conductive film. The film was then subjected to electrolytic copper plating with use of an electrolytic copper plating solution (an aqueous copper sulfate solution) to afford a transparent, electrically conductive film according to the present invention having a metal layer width W of 20 μm, a metal layer thickness T of 5 μm and a W/T ratio of 4. Further, an EVA adhesive was applied to the surface of the transparent, electrically conductive film and a PET film having a reflection preventing layer was laminated thereto.

Example 2

A layer containing alumina (refractive index 1.56) with an average particle diameter of 0.1 m was laminated to a surface of a PET film (light transmittance 92%, refractive index 1.55) to afford a transparent film having concaves and convexes with an average height of 0.05 µm. Then, a photosensitive resist (PER20 SC03, a product of Taiyo Ink Mfg. Co., Ltd.) was applied onto the film surface to a thickness of 10 µm, followed by exposure and development, to afford a film having 300×300 µm resist blocks arranged at 20 µm intervals. Next, the film was subject to electroless copper plating in the same way as in Example 1 to afford a transparent, electrically conductive film. This film was then subjected to electrolytic copper plating to afford a transparent, electrically conductive film according to the present invention having a metal layer width W of 20 µm, a metal layer thickness of 5 µm and a W/T ratio of 4. An EVA adhesive was applied to the surface of the transparent, electrically conductive film and a PET film having a reflection preventing layer was laminated thereto.

Example 3

A layer containing silica (refractive index 1.46) with an average particle diameter of 0.1 µm was laminated to a surface of a PET film (light transmittance 92%, refractive index 1.55) to afford a transparent film having concaves and convexes with an average height of 0.05 µm. Then, a photosensitive resist (PER20m SC03, a product of Taiyo Ink Mfg. Co., Ltd.) was applied onto the film surface to a thickness of 10 µm, followed by exposure and development, to afford a film having 100×100 µm resist blocks arranged at 50 µm intervals. Next, the film was subjected to electroless copper plating in the same way as in Example 1 to afford a transparent, electrically conductive film according to the present invention having a metal layer width W of 50 µm, a metal layer thickness T of 0.1 µm and a W/T ratio of 500. A EVA adhesive was applied to the surface of the transparent, electrically conductive film and a PET film having a reflection preventing layer was laminated thereto.

Example 4

A surface of a PET film (light transmittance 92%, refractive index 1.55) was etched with chromic acid to afford a transparent film having concaves and convexes with an average height of 0.05 µm. Then, a photosensitive resist (PER20 SC03, a product of Taiyo Ink Mfg. Co., Ltd.) was applied onto the film surface to a thickness of 10 µm, followed by exposure and development, to fabricate a film having 300×300 µm resist blocks arranged at 20 µm intervals. The film was then subjected to electroless copper plating in the same way as in Example 1 and was further subjected to electrolytic copper plating to afford a transparent, electrically conductive film according to the present invention having a metal layer width W of 20 µm, a metal layer thickness T of 5 µm and a W/T ratio of 4. Further, an EVA adhesive was applied to the surface of the transparent, electrically conductive film and a PET film having a reflection preventing layer was laminated thereto.

Example 5

A layer containing titanium oxide (refractive index 2.75) with an average particle diameter of 0.1 µm was laminated to a surface of a PET film (light transmittance 92%, refractive index 1.55) to afford a transparent film having concaves and convexes with an average height of 0.05 µm. Then, a photosensitive resist (PER20 SC03, a product of Taiyo Ink Mfg. Co., Ltd.) was applied onto the film surface to a thickness of 10 µm, followed by exposure and development, to afford a film having 300×300 µm resist blocks arranged at 20 µm intervals. The film was then subjected to electroless copper plating in the same way as in Example 1 to afford a transparent, electrically conducive film. The film was further subjected to electrolytic copper plating to afford a transparent, electrically conductive film having a metal layer width W of 20 µm, a metal layer thickness T of 5 µm and a W/T ratio of 4. Further, an EVA adhesive was applied to the surface of the transparent, electrically conductive film and a PET film having a reflection preventing layer was laminated thereto.

Comparative Example 1

Palladium catalyst ink was printed by screen printing to a surface of a PET film (light transmittance 92%, refractive index 1.55) in the shape of a square lattice pattern having a line width of 30 µm and a space of 300 µm. The film was then subjected to electroless copper plating in the same way as in Example 1 to afford a transparent, electrically conductive film having a metal layer width W of 30 µm, a metal layer thickness T of 20 µm and a W/T ratio of 0.67. Further, an EVA adhesive was applied to the surface of the transparent, electrically conductive film and a PET film having a reflection preventing layer was laminated thereto.

Comparative Example 2

A layer containing silica (refractive index 1.46) with an average particle diameter of 0.1 µm was laminated to a surface of a PET film (light transmittance 92%, refractive index 1.55) to afford a transparent film having concaves and convexes with an average height of 0.05 µm. Then, a photosensitive resist (PER20 SC03, a product of Taiyo Ink Mfg. Co., Ltd.) was applied onto the film surface to a thickness of 10 µm, followed by exposure and development, to afford a film having 300×300 µm resist blocks arranged at 70 µm intervals. The film was then subjected to electroless copper plating in the same way as in Example 1 to afford a transparent, electrically conductive film having a metal layer width W of 70 µm, a metal layer thickness T of 0.1 µm and a W/T ratio of 700. Further, an EVA adhesive was applied to the surface of the transparent, electrically conductive film and a PET film having a reflection preventing layer was laminated thereto.

Comparative Example 3

A layer containing silica (refractive index 1.46) having an average particle diameter of 1 µm was laminated to a surface of a PET film (light transmittance 92%, refractive index 1.55) to afford a transparent film having concaves and convexes with an average height of 0.8 µm. Then, a photosensitive resist (PER20 SC03, a product of Taiyo Ink Mfg. Co., Ltd.) was applied onto the film surface to a thickness of 10 µm, followed by exposure and development, to afford a film having 300× 300 µm resist blocks arranged at 20 µm intervals. The film was then subjected to electroless copper plating in the same way as in Example 1 to afford a transparent, electrically conductive film. The film was further subjected to electrolytic copper plating to afford a transparent, electrically conductive film having a metal layer width W of 20 µm, a metal layer thickness T of 40 µm and a W/T ratio of 0.5. Further, an EVA adhesive was applied to the surface of the transparent, electrically conductive film and a PET film having a reflection preventing layer was laminated thereto.

Comparative Example 4

A surface of a PET film (light transmittance 92%, refractive index 1.55) was subjected to sandblasting to afford a transparent film having concaves and convexes with an average height of 0.5 μm. Then, a photosensitive resist (PER20 SC03, a product of Taiyo Ink Mfg. Co., Ltd.) was applied onto the film surface to a thickness of 10 μm, followed by exposure and development, to afford a film having 300×300 μm resist blocks arranged at 20 μm intervals. The film was then subjected to electroless copper plating in the same way as in Example 1 to afford a transparent, electrically conductive film. The film was further subjected to electrolytic copper plating to afford a transparent, electrically conductive film according to the present invention having a metal layer width W of 20 μm, a metal layer thickness T of 5 μm and a W/T ratio of 4. Further, an EVA adhesive was applied to the surface of the transparent, electrically conductive film and a PET film having a reflection preventing film was laminated thereto.

Comparative Example 5

A photosensitive resist (PER20 SC03, a product of Taiyo Ink Mfg. Co., Ltd.) was applied to a concave/convex-free PET film surface (light transmittance 92%, refractive index 1.55) to a thickness of 10 μm, followed by exposure and development, to afford a film having 300×300 μm resist blocks arranged at 20 μm intervals. The film was then subjected to electroless copper plating in the same way as in Example 1 to afford a transparent, electrically conductive film. The film was further subjected to electrolytic copper plating to afford a transparent, electrically conductive film according to the present invention having a metal layer width W of 20 μm, a metal layer thickness T of 5 μm and a W/T ratio of 4. Further, an EVA adhesive was applied to the surface of the transparent, electrically conductive film and a PET film having a reflection preventing layer was laminated thereto.

The transparent, electrically conductive films obtained in the above Examples 1 to 5 and Comparative Examples 1 to 5 were evaluated, the results of which are all shown in Table 1.

TABLE 1

| | Film | Filler (Particle Dia.) | Filler-Film Difference in Refractive Index | Concaves/Convexes of Film | Metal Layer Width, W | Metal Layer Height, T | W/T | Electrical Conductivity | Transmittance | Film Appearance after Lamination |
|---|---|---|---|---|---|---|---|---|---|---|
| Example 1 | PET | Silica (0.1 μm) | 0.09 | 0.05 μm | 20 | 5 | 4 | 0.1 Ω/□ | 80% | Air bubbles not included |
| Example 2 | PET | Alumina (0.1 μm) | 0.01 | 0.05 μm | 20 | 5 | 4 | 0.1 Ω/□ | 80% | Air bubbles not included |
| Example 3 | PET | Silica (0.1 μm) | 0.09 | 0.05 μm | 50 | 0.1 | 500 | 0.5 Ω/□ | 75% | Air bubbles not included |
| Example 4 | PET | — | — | 0.05 μm | 20 | 5 | 4 | 0.1 Ω/□ | 80% | Air bubbles not included |
| Example 5 | PET | Titanium oxide (0.1 μm) | 1.2 | 0.05 μm | 20 | 5 | 4 | 0.10 Ω/□ | 70% | Air bubbles not included |
| Comparative Example 1 | PET | — | — | — | 30 | 20 | 0.67 | 0.5 Ω/□ | 60% | Air bubbles included between films and breaking of line recognized |
| Comparative Example 2 | PET | Silica (0.1 μm) | 0.09 | 0.05 μm | 70 | 0.1 | 700 | 50 Ω/□ | 60% | Air bubbles not included, poor visibility |
| Comparative Example 3 | PET | Silica (1 μm) | 0.09 | 0.5 μm | 20 | 5 | 4 | 0.10 Ω/□ | 50% | Air bubbles not included, poor visibility |
| Comparative Example 4 | PET | — | — | 0.2 μm | 20 | 5 | 4 | 0.1 Ω/□ | 40% | Metal layer partially peeled off |

What is claimed is:

1. A process for producing a transparent, electrically conductive film, comprising the steps of:
    forming a multitude of concaves and convexes having an average height of not larger than 0.1 μm on both sides or one side of a transparent film;
    forming a resist layer having a discrete pattern shape on the transparent film on its concave-convex side and leaving portions of the concave-convex side exposed;
    applying a catalyst for plating onto the concave-convex side and over both the resist layer and exposed portions;
    removing the resist layer from the concave-convex side, such that the catalyst is not applied on portions of the concave-convex side that had been covered by the resist layer;
    plating a metal layer on top of the catalyst; and
    blackening the metal layer, the metal layer having a width W to height T ratio, W/T, of $1 \leq W/T \leq 500$.

2. A process as set forth in claim 1, wherein the concaves and convexes on both sides or one side of the transparent film are formed by incorporating a filler in the transparent film.

3. A process as set forth in claim 2, wherein the difference in refractive index of light between the filler and the transparent film is not larger than 0.15.

4. A process as set forth in claim 2, wherein the transparent film is a polyethylene terephthalate film and the filler is silica or alumina.

5. A process as set forth in claim 3, wherein the transparent film is a polyethylene terephthalate film and the filler is silica or alumina.

* * * * *